(12) United States Patent
Kirsch et al.

(10) Patent No.: US 12,193,328 B2
(45) Date of Patent: Jan. 7, 2025

(54) AROMATIC COMPOUNDS AND USE THEREOF FOR FORMATION OF MOLECULAR LAYERS AND FABRICATION OF SWITCHING ELEMENTS FOR MEMRISTIVE DEVICES

(71) Applicant: MERCK PATENT GMBH, Darmstadt (DE)

(72) Inventors: Peer Kirsch, Seeheim-Jugenheim (DE); Sebastian Resch, Mainz (DE); Henning Seim, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 489 days.

(21) Appl. No.: 17/609,456

(22) PCT Filed: May 8, 2020

(86) PCT No.: PCT/EP2020/062799
§ 371 (c)(1),
(2) Date: Nov. 8, 2021

(87) PCT Pub. No.: WO2020/225398
PCT Pub. Date: Nov. 12, 2020

(65) Prior Publication Data
US 2022/0238816 A1 Jul. 28, 2022

(30) Foreign Application Priority Data
May 9, 2019 (EP) ..................... 19173415

(51) Int. Cl.
| C07F 9/38 | (2006.01) |
| C07F 9/655 | (2006.01) |
| H10K 10/00 | (2023.01) |
| H10K 10/50 | (2023.01) |
| H10K 10/82 | (2023.01) |
| H10K 71/60 | (2023.01) |
| H10K 85/60 | (2023.01) |

(52) U.S. Cl.
CPC ........... H10K 85/6574 (2023.02); C07F 9/38 (2013.01); C07F 9/3834 (2013.01); C07F 9/65517 (2013.01); H10K 10/50 (2023.02); H10K 10/701 (2023.02); H10K 10/82 (2023.02); H10K 71/60 (2023.02); H10K 85/60 (2023.02); H10K 85/615 (2023.02)

(58) Field of Classification Search
CPC ................................ C07F 9/38; C07F 9/3834
See application file for complete search history.

(56) References Cited

U.S. PATENT DOCUMENTS

| 4,389,416 A | 6/1983 | Plattner |
| 6,998,637 B2 | 2/2006 | Luyken et al. |
| 8,691,392 B2 | 4/2014 | Wessels et al. |
| 9,172,053 B2 | 10/2015 | Hayashi et al. |
| 10,741,778 B2 | 8/2020 | Kirsch et al. |
| 11,063,227 B2 | 7/2021 | Kirsch et al. |
| 2005/0099209 A1 | 5/2005 | Luyken et al. |
| 2011/0108793 A1 | 5/2011 | Wessels et al. |
| 2011/0251190 A1 | 10/2011 | Cheng et al. |
| 2015/0108421 A1 | 4/2015 | Hayashi et al. |
| 2016/0068754 A1* | 3/2016 | Fujimori .............. C07D 407/06 252/299.61 |
| 2018/0006253 A1 | 1/2018 | Kirsch et al. |
| 2019/0029990 A1 | 1/2019 | Ahlmark et al. |
| 2019/0312216 A1 | 10/2019 | Kirsch et al. |
| 2021/0292651 A1 | 9/2021 | Kirsch et al. |

FOREIGN PATENT DOCUMENTS

| EP | 2112692 A1 | 10/2009 |
| JP | S55120565 A | 9/1980 |
| JP | 2013522305 A | 6/2013 |
| WO | 12127542 A1 | 9/2012 |
| WO | 16110301 A1 | 7/2016 |
| WO | 18007337 A2 | 1/2018 |

OTHER PUBLICATIONS

Tanaka et al., Journal of Agricultural and Food Chemistry (1990), 38(2), 553-559. (Year: 1990).*
Chemical Abstracts Registry No. 1409072-13-4, indexed in the Registry file on STN CAS Online Dec. 2, 2012. (Year: 2012).*
International Search Report PCT/EP2020/062799 dated Jul. 23, 2020 (pp. 1-2).
Office Action in corresponding JP appln. 2021-566138 dispatched May 10, 2024 (pp. 1-2).

* cited by examiner

*Primary Examiner* — Laura L Stockton
(74) *Attorney, Agent, or Firm* — MILLEN, WHITE, ZELANO & BRANIGAN, P.C.; Brion P. Heaney

(57) ABSTRACT

The present invention relates to a compounds of formula I $$R^1-(A^1-Z^1)_r-B^1-Z^L-A^2-(Z^3-A^3)_s-G \qquad (I)$$

in which the occurring groups and parameters have the meanings given in claim 1, to the use thereof for the formation of molecular layers, in particular self assembled monolayers, to a process for the fabrication of a switching element for memristive devices comprising said molecular layers and to a memristic device comprising said switching element.

15 Claims, 3 Drawing Sheets

AROMATIC COMPOUNDS AND USE THEREOF FOR FORMATION OF MOLECULAR LAYERS AND FABRICATION OF SWITCHING ELEMENTS FOR MEMRISTIVE DEVICES

The present invention relates to aromatic compounds, to the use thereof for the formation of molecular layers, in particular of self assembled monolayers (SAM), to a process for the fabrication of a switching element for memristive devices comprising said molecular layers and to a memristive device comprising said switching element.

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between a high and a low electrical resistance. The respective state (high resistance or low resistance) is retained even without a supply voltage, meaning that non-volatile memories can be achieved with memristors.

WO 2012/127542 A1 and US 2014/008601 A1, for example, disclose organic molecular memories which have two electrodes and an active region which is arranged between the two electrodes. The active region has a molecular layer of electrically conductive aromatic alkynes, whose conductivity can be changed under the influence of an electric field. Similar components based on redox-active bipyridinium compounds are proposed in US 2005/0099209 A1.

The known memories based on a change in conductivity or resistance have the disadvantage that the free-radical intermediates formed by the flow of current through the molecules of the molecular layer are in principle susceptible to degradation processes, which has an adverse effect on the lifetime of the components.

In WO 2018/007337 A2 an improved switching layer is described that makes use of a non-redox active molecular layer comprising dipolar compounds linked to a substrate via an aliphatic spacer group where the compounds are reversibly switched by application of an electric field which causes re-orientation of the molecular dipole and thus enabling a low-resistive state and a high-resistive state depending on the respective orientation of the molecules.

In order to obtain electrically switchable tunnel junctions from organic compounds with a conformationally flexible dipole, a molecular layer enclosed as a sandwich between two conductive electrodes is required. The deposition of this molecular layer onto electrodes is achieved either by spin-coating or by dip-coating from an organic solvent. The basic principle of the resulting memory device is described in WO 2016/110301 A1 and WO 2018/007337 A2. In order to limit the formation of short circuits between top electrode and bottom electrode, the monolayer has to be as tight as possible, without pinholes allowing the permeation of top electrode material during its deposition process. There is also a strong demand for materials which form molecular layers of acceptable quality within very short deposition times.

A problem to be solved by the present invention is to provide improved materials for the fabrication of switchable molecular layers.

To solve the problem a compound of formula I shown below is provided which comprises a ring with an anchor group connected to a polar ring via a one-atomic linking group, where the compound of formula I can be bonded onto a substrate by means of the anchor group.

The present invention further relates to a process for the fabrication of a switching element comprising a molecular layer obtainable from one or more compounds of formula I. The present invention further relates to a memristive device comprising said switching element.

Preferred embodiments are subject-matter of the dependent claims and can also be taken from the description.

The present invention relates to a compound of formula I $$R^1\text{-}(A^1\text{-}Z^1)_r\text{—}B^1\text{—}Z^L\text{-}A^2\text{-}(Z^3\text{-}A^3)_s\text{-}G \qquad (I)$$

in which $R^1$ H, denotes straight chain or branched alkyl or alkoxy each having 1 to 20 C atoms, where one or more $CH_2$ groups in these radicals may each be replaced, independently of one another, by —C≡C—, —CH=CH—,

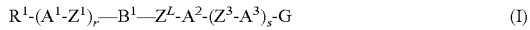

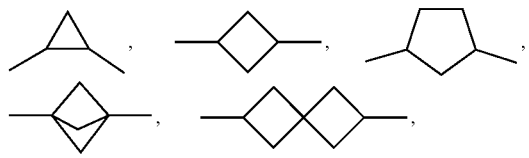

—O—, —S—, —$CF_2$O—, —O$CF_2$—, —CO—O—, —O—CO—, —Si$R^0R^{00}$—, —NH—, —$NR^0$— or —$SO_2$—
in such a way that O atoms are not linked directly to one another, and in which one or more H atoms may be replaced by halogen, CN, SCN or $SF_5$, or alternatively, $R^1$ denotes a group Dia-$Z^D$, Dia denotes a diamondoid radical, preferably derived from a lower diamandoid, very preferably selected from the group consisting of adamantyl, diamantyl, triamantyl, in which one or more H atoms can be replaced by alkyl or alkoxy having up to 12 C atoms, in particular

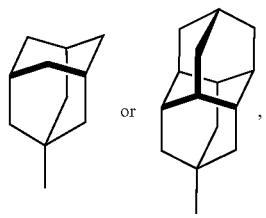

or $Z^D$ has one of the meanings of $Z^1$ and $Z^3$ or denotes a spacer group, $Z^1$, $Z^3$ on each occurrence, identically or differently, denote a single bond, —$CF_2O$—, —$OCF_2$—, —$CF_2S$—, —$SCF_2$—, —$CH_2O$—, —$OCH_2$—, —$C(O)O$—, —$OC(O)$—, —$C(O)S$—, —$SC(O)$—, —$(CH_2)_{n1}$—, —$(CF_2)_{n2}$—, —$CF_2$—$CH_2$—, —$CH_2$—$CF_2$—, —$CH$=$CH$—, —$CF$=$CF$—, —$CF$=$CH$—, —$CH$=$CF$—, —$(CH_2)_{n3}O$—, —$O(CH_2)_{n4}$—, —$C$≡$C$—, —$O$—, —$S$—, —$CH$=$N$—, —$N$=$CH$—, —$N$=$N$—, —$N$=$N(O)$—, —$N(O)$=$N$— or —$N$=$C$—$C$=$N$—, n1, n2, n3, n4 identically or differently, are 1, 2, 3, 4, 5, 6, 7, 8, 9 or 10, $Z^L$ denotes —$O$—, —$S$—, —$CH_2$—, —$C(O)$—, —$CF_2$—, —$CHF$—, —$C(R^x)_2$—, —$S(O)$—, —$SO_2$—, $R^0$, $R^{00}$, identically or differently, denote an alkyl or alkoxy radical having 1 to 15 C atoms, in which, in addition, one or more H atoms may be replaced by halogen, $R^x$ denotes straight-chain or branched alkyl having 1 to 6 C atoms, $A^1$, $A^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y, $A^2$ denotes an aromatic or heteroaromatic ring having 5 to 25 ring atoms, which may also contain condensed rings and which may be mono- or polysubstituted by Y, Y on each occurrence, identically or differently, denotes F, Cl, CN, SCN, $SF_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, or cycloalkyl or alkylcycloalkyl each having 3 to 12 C atoms, preferably methyl, ethyl, isopropyl, cylopropyl, cyclobutyl, cyclopentyl, cyclohexyl, trifluoromethyl, methoxy or trifluoromethoxy, $B^1$ denotes

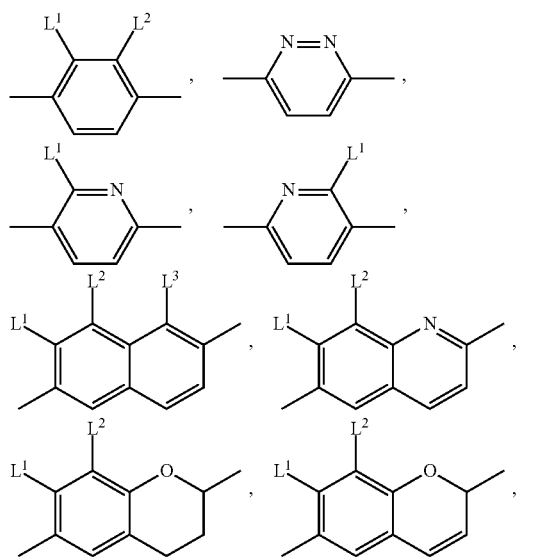

-continued

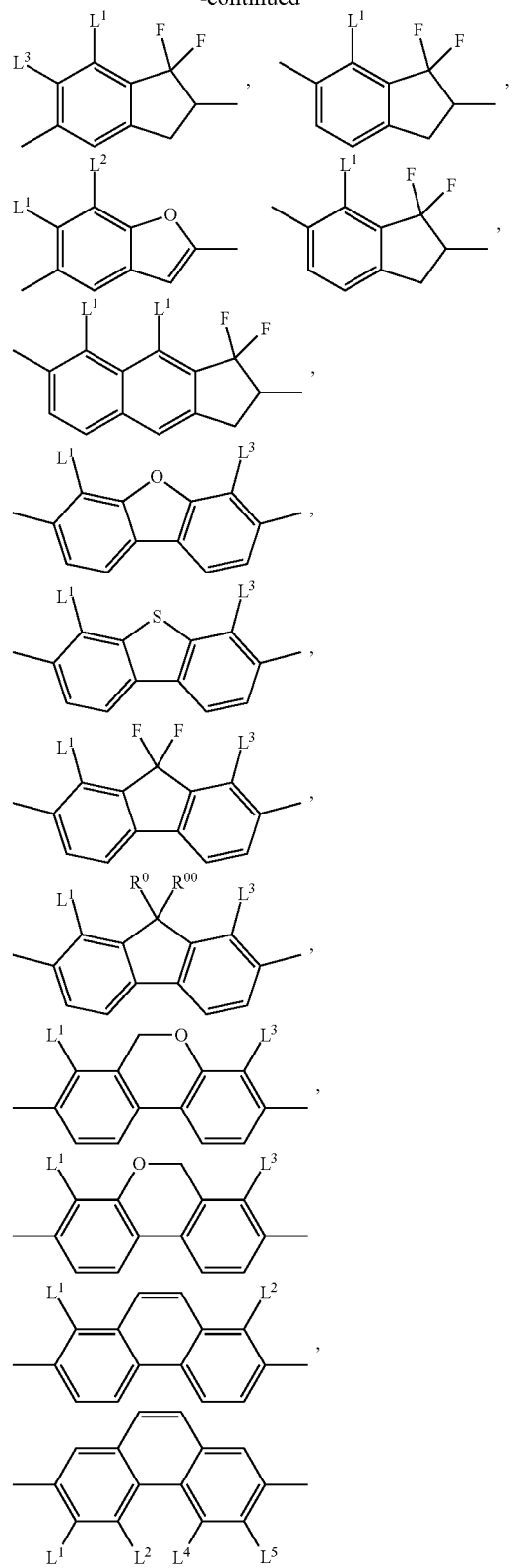

where the groups may be oriented in both directions, $L^1$ to $L^5$, independently of one another, denote F, Cl, Br, I, CN, $SF_5$, $CF_3$ or $OCF_3$, preferably Cl or F, where $L^3$ may alternatively also denote H, G denotes —CH=CH$_2$, —OH, —CH(CH$_2$OH)$_2$, —C(CH$_2$OH)$_3$, —B(OH)$_2$, —SH, —SO$_2$OH, —OP(O)(OH)$_2$, —PO(OH)$_2$, —C(OH)(PO(OH)$_2$)$_2$, —COOH, —Si(OR$^x$)$_3$ or —SiCl$_3$, —SO$_2$OR$^V$, —OP(O)(OR$^V$)$_2$, —PO(OR$^V$)$_2$, —C(OH)(PO(OR$^V$)$_2$)$_2$, —COOR$^V$, —Si(OR$^V$)$_3$, R$^V$ denotes alkyl having 1 to 20 C atoms, preferably secondary or tertiary alkyl having 3 to 10 C atoms, r is 0, 1 or 2, and s is 0, 1 or 2, where r+s≤4.

The compounds of formula I are distinguished by excellent solubility in polar aprotic solvents, such as ethyl acetate, 1-methoxy-2-propanol acetate, acetone, ethylmethylketone, cyclohexanone and the like.

Furthermore, they enable fast formation of molecular layers, fast process times for dip-coating and high quality of monolayers deposited by spin-coating.

The molecular layers obtained from compounds of formula I are distinguished by dense packing and advantageously low water contact angles and enable the fabrication of switching elements for memristive devices that can be patterned by photolithography using standard industrial processes. Furthermore, these monolayers have a very high thermal stability even at temperatures above 300° C.

Switching devices comprising a molecular layer obtained from the compounds of formula I exhibit advantageously high current densities.

Figure 1:
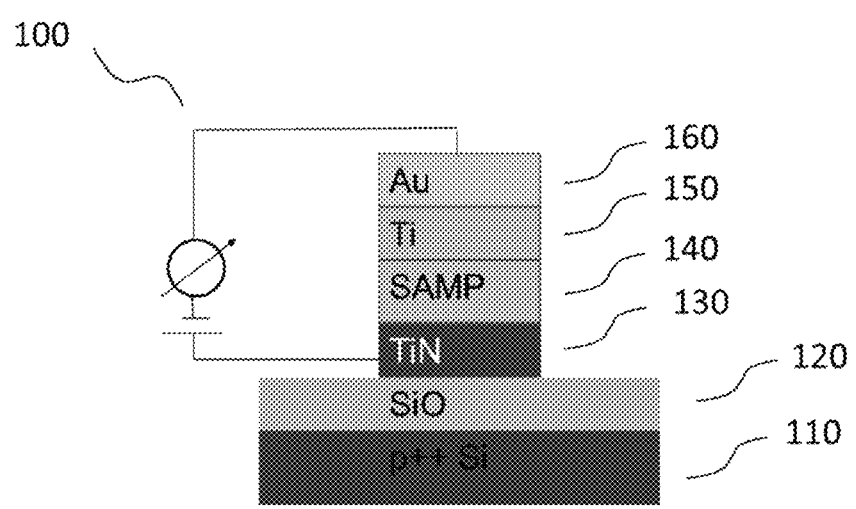
FIG. 1 a schematic illustration of the layer structure of a memristive memory element, FIG. 2 an exemplary logarithmic plot of measured current density values versus applied voltages of an exemplary embodiment of a memory device having a resistive switching memory element, FIG. 3 an exemplary logarithmic plot of measured current density values versus applied voltages of a comparative resistive switching memory element.

The term "diamondoids" refers to substituted and unsubstituted cage compounds of the adamantane series including adamantane, diamantane, triamantane, tetramantanes, pentamantanes, hexamantanes, heptamantanes, octamantanes, and the like, including all isomers and stereoisomers thereof. The compounds have a "diamondoid" topology, which means their carbon atom arrangement is superimposable on a fragment of a face centered cubic diamond lattice. Substituted diamondoids from the first of the series are preferable with 1 to 4 independently-selected alkyl or alkoxy substituents.

Diamondoids include "lower diamondoids" and "higher diamondoids," as these terms are defined herein, as well as mixtures of any combination of lower and higher diamondoids. The term "lower diamondoids" refers to adamantane, diamantane and triamantane and any and/or all unsubstituted and substituted derivatives of adamantane, diamantane and triamantane. These lower diamondoid components show no isomers or chirality and are readily synthesized, distinguishing them from "higher diamondoids." The term "higher diamondoids" refers to any and/or all substituted and unsubstituted tetramantane components; to any and/or all substituted and unsubstituted pentamantane components; to any and/or all substituted and unsubstituted hexamantane components; to any and/or all substituted and unsubstituted heptamantane components; to any and/or all substituted and unsubstituted octamantane components; as well as mixtures of the above and isomers and stereoisomers of tetramantane, pentamantane, hexamantane, heptamantane, and octamantane. Adamantane chemistry has been reviewed by Fort, Jr. et al. in "Adamantane: Consequences of the Diamondoid Structure," Chem. Rev. vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane, (two of which represent an enantiomeric pair), i.e., four different possible ways or arranging the four adamantane subunits. The number of possible isomers increases non-linearly with each higher member of the diamondoid series, pentamantane, hexamantane, heptamantane, octamantane, etc.

As used herein, an anchor group is a functional group by means of which a compound is adsorbed onto or bonded to the surface of a substrate by physisorption, chemisorption or by chemical reaction.

A spacer group in the sense of the present invention is a flexible chain between two rigid groups which causes a separation between these substructures and, owing to its flexibility, at the same time improves the mobility of at least one of these groups after bonding to a substrate.

If $Z^D$ denotes a spacer group the group is preferably selected from the formula Sp'—X', so that the radical Dia-$Z^D$— of formula I corresponds to the formula Dia-Sp'—X'—, in which Sp' denotes straight-chain or branched alkylene having 1 to 20, preferably 1 to 12 C atoms, which is optionally mono- or polysubstituted by F, Cl, Br, I or CN and in which, in addition, one or more non-adjacent CH$_2$ groups may each be replaced, independently of one another, by —O—, —S—, —NH—, —NR$^O$—, —SiR$^{OO}$R$^{OOO}$—, —CO—, —COO—, —OCO—, —OCO—O—, —S—CO—, —CO—S—, —NR$^O$—CO—O—, —O—CO—NR$^O$—, —NR$^O$—CO—NR$^O$—, —CH=CH— or —C≡C— in such a way that O and/or S atoms are not linked directly to one another, X' denotes —O—, —S—, —CO—, —COO—, —OCO—, —O—COO—, —CO—NR$^{OO}$—, —NR$^{OO}$—CO—, —NR$^{OO}$—CO—NR$^{OO}$—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^{OO}$—, —CY$^x$=CY$^{x'}$—, —C≡C—, —CH=CH—COO—, —OCO—CH=CH— or a single bond, R$^O$, R$^{OO}$ and R$^{OOO}$ each, independently of one another, denote H or alkyl having 1 to 12 C atoms, and Y$^x$ and Y$^{x'}$ each, independently of one another, denote H, F, Cl or CN.

X' is preferably —O—, —S—, —CO—, —COO—, —OCO—, —O—COO—, —CO—NR$^O$—, —NR$^O$—CO—, —NR$^O$—CO—NR$^O$— or a single bond.

Preferred spacer groups Sp' are —(CH$_2$)$_{p1}$—, —(CF$_2$)$_{p1}$—, —(CH$_2$CH$_2$O)$_{q1}$—CH$_2$CH$_2$—, —(CF$_2$CF$_2$O)$_{q1}$—CF$_2$CF$_2$—, —CH$_2$CH$_2$—S—CH$_2$CH$_2$—, —CH$_2$CH$_2$—NH—CH$_2$CH$_2$— or —(SiR$^{OO}$R$^{OOO}$—O)$_{p1}$—, in which p1 is an integer from 1 to 12, q1 is an integer from 1 to 3, and R$^{OO}$ and R$^{OOO}$ have the meanings indicated above.

Particularly preferred groups —X'-Sp'— are —(CH$_2$)$_{p1}$—, —O—(CH$_2$)$_{p1}$—, —(CF$_2$)$_{p1}$—, —O(CF$_2$)$_{p1}$—, —OCO—(CH$_2$)$_{p1}$— and —OC(O)O—(CH$_2$)$_{p1}$—, in which p1 has the meaning indicated above.

Particularly preferred groups Sp' are, for example, in each case straight-chain ethylene, propylene, butylene, pentylene, hexylene, heptylene, octylene, nonylene, decylene, undecylene, dodecylene, octadecylene, perfluoroethylene, perfluoropropylene, perfluorobutylene, perfluoropentylene, perfluorohexylene, perfluoroheptylene, perfluorooctylene, perfluorononylene, perfluorodecylene, perfluoroundecylene, perfluorododecylene, perfluorooctadecylene, ethyleneoxyethylene, methyleneeoxybutylene, ethylenethioethylene, ethylene-N-methyliminoethylene, 1-methylalkylene, ethenylene, propenylene and butenylene.

Particularly preferred groups X' are —O— or a single bond.

Halogen is F, Cl, Br and I.

Herein, alkyl is straight-chain or branched and has 1 to 15 C atoms, is preferably straight-chain and has, unless indicated otherwise, 1, 2, 3, 4, 5, 6 or 7 C atoms and is accordingly preferably methyl, ethyl, propyl, butyl, pentyl, hexyl or heptyl.

Branched alkyl can be racemic or non-racemic (optically active).

Herein, an alkoxy radical is straight-chain or branched and contains 1 to 15 C atoms. It is preferably straight-chain and has, unless indicated otherwise, 1, 2, 3, 4, 5, 6 or 7 C atoms and is accordingly preferably methoxy, ethoxy, propoxy, butoxy, pentoxy, hexoxy or heptoxy.

Herein, an alkenyl radical is preferably an alkenyl radical having 2 to 15 C atoms, which is straight-chain or branched and contains at least one C—C double bond. It is preferably straight-chain and has 2 to 7 C atoms. Accordingly, it is preferably vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl. If the two C atoms of the C—C double bond are substituted, the alkenyl radical can be in the form of E and/or Z isomer (trans/cis). In general, the respective E isomers are preferred. Of the alkenyl radicals, prop-2-enyl, but-2- and -3-enyl, and pent-3- and -4-enyl are particularly preferred.

Herein, alkynyl is taken to mean an alkynyl radical having 2 to 15 C atoms, which is straight-chain or branched and contains at least one C—C triple bond. 1- and 2-propynyl and 1-, 2- and 3-butynyl are preferred.

In formula I, preferred aryl groups are derived, for example, from the parent structures benzene, naphthalene, tetrahydronaphthalene, 9,10-dihydro-phenanthrene, fluorene, indene and indane.

In formula I, preferred heteroaryl groups are, for example, five-membered rings, such as, for example, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole and 1,3,4-thiadiazole, six-membered rings, such as, for example, pyridine, pyridazine, pyrimidine, pyrazine, 1,3,5-triazine, 1,2,4-triazine and 1,2,3-triazine, or condensed rings, such as, for example, indole, isoindole, indolizine, indazole, benzimidazole, benzotriazole, purine, naphthimidazole, benzoxazole, naphthoxazole, benzothiazole, benzofuran, isobenzofuran, dibenzofuran, thieno[2,3b]thiophene, thieno[3,2b]thiophene, dithienothiophene, isobenzothiophene, dibenzothiophene, benzothiadiazo-thiophene, 2H-chromen (2H-1-benzopyran), 4H-chromene (4H-1-benzopyran) and coumarin (2H-chromen-2-one), or combinations of these groups.

In formula I, preferred cyloaliphatic groups are cyclobutane, cyclopentane, cyclohexane, cyclohexene, cycloheptane, decahydronaphthalene, bicyclo-[1.1.1]pentane, bicyclo[2.2.2]octane, spiro[3.3]heptane and octahydro-4,7-methanoindane.

In formula I, preferred heteroaliphatic groups are tetrahydrofuran, dioxolane, tetrahydrothiofuran, pyran, dioxane, dithiane, silinane, piperidine and pyrrolidine.

Preferably $A^1$ and $A^3$, on each occurrence, identically or differently are selected from the following groups:

a) 1,4-phenylene, in which one or two CH groups may be replaced by N and in which, in addition, one or more H atoms may be replaced by Y, b) the group consisting of trans-1,4-cyclohexylene and 1,4-cyclohexenylene, in which one or more non-adjacent CH$_2$ groups may be replaced by —O— and/or —S— and in which, in addition, one or more H atoms may be replaced by Y, and c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which one or more H atoms may be replaced by Y, where Y has the meanings given above.

In formula I and its subformulae, very preferably $A^1$ and identically or differently, denote

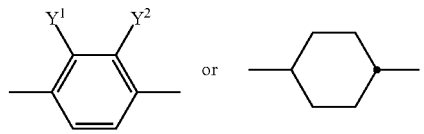

$A^2$-$Z^L$ denotes

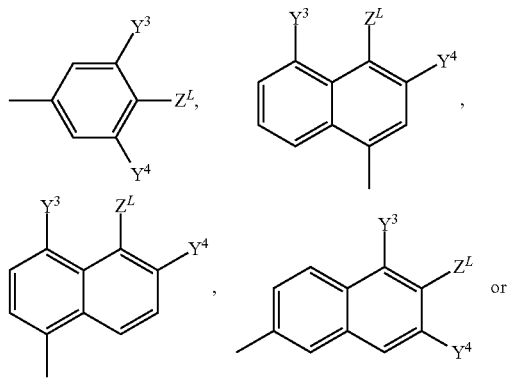

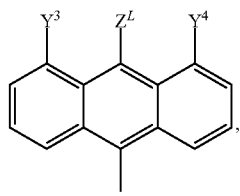

$B^1$ denotes

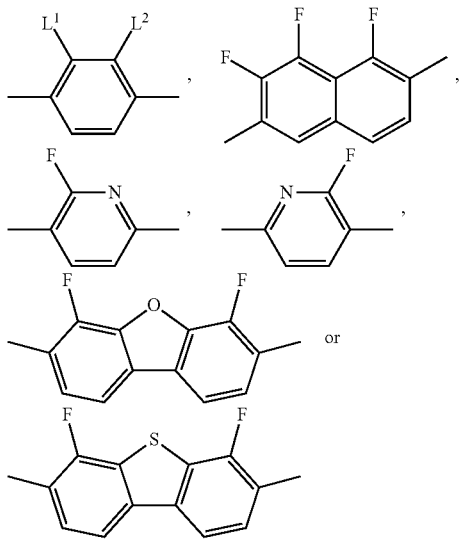

$R^1$ denotes H, straight chain or branched alkyl, alkenyl, alkynyl, alkoxy each having up to 12 C atoms, adamantyl or adamantylmethyloxy, $L^1$ and $L^2$ identically or differently, denote F or Cl, $Y^1$ and $Y^2$ identically or differently, have one of the meanings given above for Y and preferably denote H, F or Cl, $Y^3$ and $Y^4$, identically or differently, have one of the meanings given above for $Y^3$ and $Y^4$ and preferably denote methyl, ethyl, isopropyl, cyclopropyl, cyclobutyl, cyclopentyl, cyclopentenyl, cyclohexyl, cyclohexenyl, methoxy, trifluoromethyl, trifluoromethoxy, or trifluoromethylthio $Z^L$ denotes —O—, $Z^1$, $Z^2$, independently of one another, denote a single bond, —C(O)O—, —OC(O)—, —CF$_2$O—, —OCF$_2$—, —CH$_2$O—, OCH$_2$— or —CH$_2$CH$_2$—, in particular a single bond, and/or G denotes —OP(O)(OH)$_2$, —PO(OH)$_2$, or —COH(PO(OH)$_2$)$_2$.

Very preferred sub-formulae of the formula I are the sub-formulae I-1 to I-6:

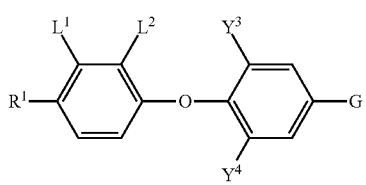

I-1

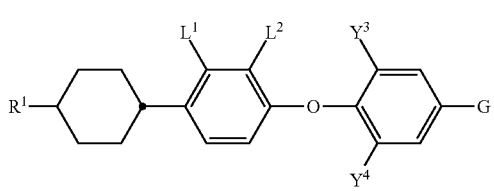

I-2

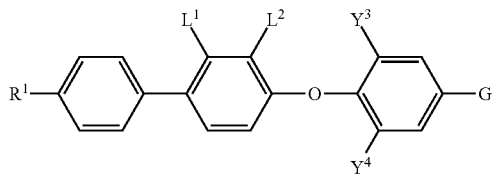

I-3

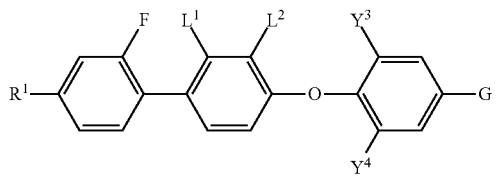

I-4

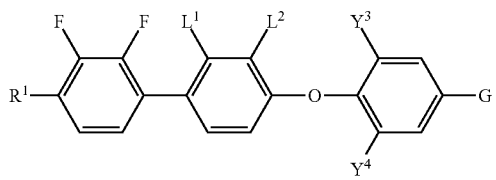

I-5

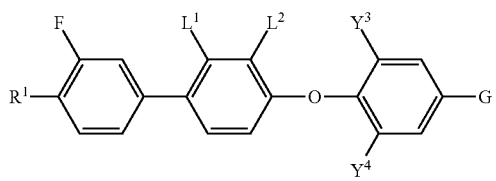

I-6 in which the occurring groups have the meanings defined above for formula I, and preferably $R^1$ denotes alkyl having 1 to 7 C atom, $L^1$ and $L^2$ identically or differently, denote F or Cl, $Y^3$ and $Y^4$, identically or differently, have one of the meanings given above and preferably denote methyl, and G denotes —PO(OH)$_2$, or —COH(PO(OH)$_2$)$_2$.

According to another aspect of the invention there is provided a chiral non-racemic compound of formula I.

The molecular layers obtained from chiral compounds of formula I enable memristic devices with significantly reduced stochastic noise and faster switching, reducing the read and write error rate, which has a positive effect on energy-efficiency. In addition, increased tunnel current are observed allowing for the integration to smaller junction sizes.

Preferably, the chiral compound has an enantiomeric excess (ee) of above 50%, preferably above 80%, 90%, 95%, more preferably above 97%, in particular above 98%.

Chirality is achieved by a chiral group $R^1$ of formula I above having one or more, preferably one or two, very preferably one, asymmetrically substituted carbon atom (or: asymmetric carbon atom, C*), hereinafter referred to as R*.

In R* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical preferably has the formula

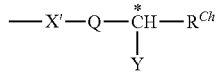

in which

X' has the meanings defined above for formula I and preferably denotes —CO—O—, —O—CO—, —O—CO—O—, —CO—, —O—, —S—, —CH=CH—, —CH=CH—COO— or a single bond, more preferably —CO—O—, —O—CO—, —O—, or a single bond, very preferably —O— or a single bond, Q denotes a single bond or optionally fluorinated alkylene having 1 to 10 carbon atoms, in which a $CH_2$ group not linked with X can also be replaced by —O—, —CO—, —O—CO—, —CO—O— or —CH=CH—, preferably alkylene having 1 to 5 carbon atoms or a single bond, particularly preferably —$CH_2$—, —$CH_2CH_2$— or a single bond, Y denotes optionally fluorinated alkyl having 1 to 15 carbon atoms, in which one or two non-adjacent $CH_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —$CH_3$, —$C_2H_5$, —$CF_3$ or Cl, $R^{Ch}$ denotes an alkyl group having 1 to 15 carbon atoms that is different from Y, in which one or two non-adjacent $CH_2$ groups can also be replaced by —O—, —CO—, —O—CO—, —CO—O— and/or —CH=CH—, preferably denotes straight-chain alkyl having 1 to 10, in particular 1 to 7, carbon atoms, in which the $CH_2$ group linked to the asymmetric carbon atom can be replaced by —O—, —O—CO— or —CO—O—.

In an embodiment in which $R^1$ of formula I denotes a group Dia-$Z^D$ as defined above, the group R* has the formula Dia-Sp* in which Sp* denotes a chiral non-racemic spacer group.

The group Dia-Sp* preferably has the formula

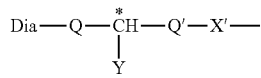

in which Dia, Q, Y and X' have the meanings defined above, and

Q' identically or differently, has the meanings given above for Q.

The compounds of the general formula I are prepared by methods known per se, as described in the literature (for example in the standard works, such as Houben-Weyl, Methoden der organischen Chemie [Methods of Organic Chemistry], Georg-Thieme-Verlag, Stuttgart), to be precise under reaction conditions which are known and are suitable for the said reactions. Use can be made here of variants which are known per se, but are not mentioned here in greater detail. Chiral groups R* and Sp* are described in A. Taugerbeck, Ch. Booth, Design and Synthesis of Chiral Nematic Liquid Crystals, in: Handbook of Liquid Crystals, Volume 3, Part III, Chapter 14, Wiley VCH, Weinheim, 2014, and can preferably be synthesised according to the syntheses described therein or references cited therein.

If desired, the starting materials can also be formed in situ by not isolating them from the reaction mixture, but instead immediately converting them further into the compounds of the general formula I.

Preferred synthetic pathways towards compounds according to the invention are shown in the scheme below and are further illustrated by means of the working examples. The syntheses can be adapted to the particular desired compounds of the general formula I by choice of suitable starting materials. For example, as shown in scheme 1, reaction of phenolates or thiophenolates (1) with fluoronitroaromatic compounds (2) yields aryl ethers 3 by nucleophilic replacement of fluoride. The ether 3 can be converted using standard processes via iodide 4 to the phosphonic acid 5.

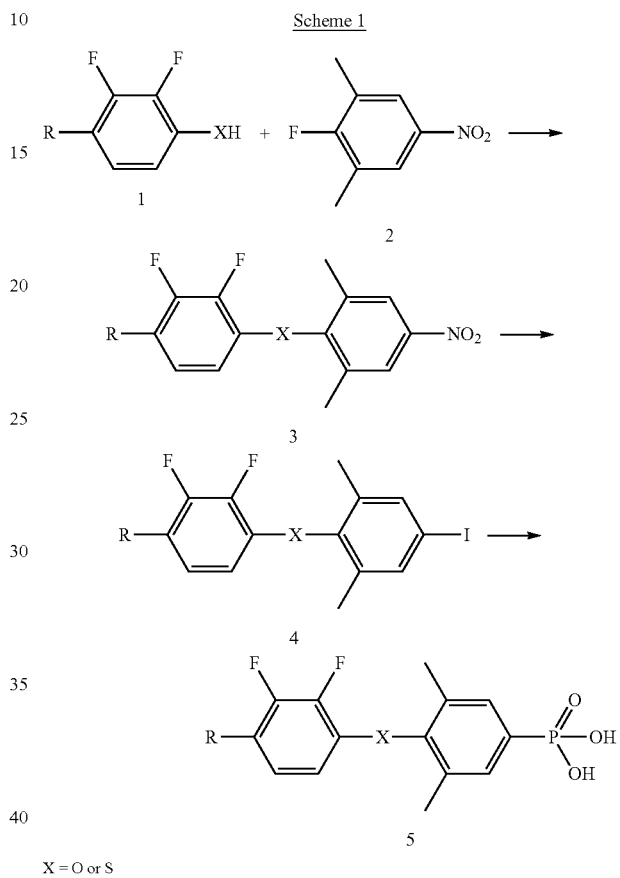

X = O or S

The invention furthermore relates to a process for the production of the switching element according to the invention comprising at least the following steps:

a) production of a first electrode with a surface,
b) deposition of a monolayer comprising one or more compounds of the formula I onto the surface of the first electrode,
c) application of a second electrode.

The deposition of the monolayer is carried out using the pure substance or from solution, preferably from solution. Suitable deposition methods and solvents are known to the person skilled in the art; examples are spin coating or dip coating.

According to another aspect of the invention the monolayer is fabricated from one or more compounds of formula I in which the anchor group G denotes —$SO_2OR^V$, —OP(O)$(OR^V)_2$, —PO$(OR^V)_2$, —C(OH)(PO$(OR^V)_2)_2$, —CO-$OR^V$ or —Si$(OR^V)_3$ where $R^V$ denotes alkyl having 1 to 20 C atoms, preferably a secondary or tertiary alkyl having up to 20 C atoms. These compounds are distinguished by a particularly high solubility and are well suitable for industrial processes such as spin coating. In addition, it is possible to process these compounds by gas phase deposition. The compounds serve as precursors for the corresponding free acids which are obtained in situ by thermal treatment of the compounds after deposition onto the first electrode. The first electrode is then heated to a temperature between 60° C. and 300° C., preferably between 100° C. and 250° C., in particular between 140° C. and 180° C.

In a preferred embodiment, the substrate is annealed after deposition of the monolayer. The annealing is carried out at a temperature of greater than 20° C. and less than 300° C., preferably at greater than 50° C. and less than 200° C., particularly preferably at greater than 90° C. and less than 150° C. The time duration of the annealing is 1 to 48 h, preferably 4 to 24 h, particularly preferably 8 to 16 h.

The molecular layer of the present invention is a layer of electrically insulating, non-conducting and non-semiconducting organic compounds.

The molecular layer preferably comprises molecules of the formula I or, particularly preferably, consists of molecules of the formula I.

The thickness of the layer is preferably 10 nm or less, particularly preferably 5 nm or less, very particularly preferably 2 nm or less.

The molecular layer may consist of one, two, three or more molecule layers comprising compounds of the formula I.

The molecular layer employed in accordance with the invention is preferably a molecular monolayer.

In an embodiment, the molecular layer is a self-assembled monolayer (SAM).

The production of self-assembled monolayers is known to the person skilled in the art; a review is given, for example, in A. Ulman, *Chem. Rev.* 1996, 96, 1533-1554.

In a further embodiment, the molecular layer is bonded to the substrate by chemisorption, in particular by an addition reaction or condensation reaction.

In a further embodiment, the molecular layer is bonded to the substrate by physisorption.

The degree of coverage of the substrate is preferably 90% to 100%, particularly preferably 95% to 100%, very particularly preferably 98% to 100%.

In a further embodiment, the molecular layer is covered with 1 to 10, preferably 1 to 5, particularly preferably 1 to 3, further layers of organic or inorganic adsorbates. Suitable layers comprise, for example, dielectrics, for example oxidic, fluoridic or nitridic materials, such as $TiO_2$, $Al_2O_3$, $HfO_2$, $SiO_2$, LiF and $Si_3N_4$, or metals, such as Pt, Pd, Pb, Au, Ag, Cu, Al and Mg, and eutectic compounds thereof, such as, for example, PdAu 20:80. Such layers can be built up in a thickness of a few nanometres by defined and high-precision deposition, for example by ALD (atomic layer deposition) processes.

The molecules of the molecular layer are preferably covalently bonded to the substrate. The bonding is carried out by known methods which are familiar to the person skilled in the art, for example by the addition reaction of a compound of the formula I or by esterification with hydroxyl groups located on the surface of the substrate.

For addition reactions, a suitable substrate, preferably a silicon surface—after corresponding pre-treatment with aqueous $NH_4F$ solution—can, for example, be treated in order to obtain a hydrogen-terminated surface. The surface treated in this way can then be treated at elevated temperature with exclusion of oxygen either directly with a suitable liquid compound of the formula I or a solution of the compound of the formula I in a suitable solvent. According to this aspect of the invention the group G in formula I preferably denotes $—CH=CH_2$.

For condensation reactions, a suitable substrate, preferably a silicon surface, can, for example, be treated with oxygen plasma in order to obtain a hydrophilic oxidic surface which is populated with hydroxyl groups. The surface treated in this way can then be reacted at elevated temperature either directly with a suitable, liquid compound of the formula I or a solution of the compound of the formula I in a suitable solvent. It is clear that an oxidic surface of this type merely serves for surface modification with the aim of possible derivatisation via condensation reactions and does not represent an insulator layer in the true sense. Sufficiently large tunnel currents through this oxidic surface are possible owing to the low thickness in the order of 1 nm.

In the switching elements according to the invention, the molecules of the molecular layer are bonded to a substrate or an interlayer located between the molecular monolayer and the substrate. The substrate according to the invention can perform various functions, depending on the structure of the switching elements. For example, a conductive substrate can serve as first electrode. Likewise, the substrate can be a layer of a diode.

Suitable substrates are known to the person skilled in the art. Particularly suitable substrates are selected from:
  element semiconductors, such as Si, Ge, C (diamond, graphite, graphene, fullerene), $\alpha$-Sn, B, Se and Te;
  compound semiconductors, preferably
    group III-V semiconductors, in particular GaAs, GaP, InP, InSb, InAs, GaSb, GaN, TaN, TiN, MoN, WN, AlN, InN, $Al_xGa_{1-x}As$ and $In_xGa_{1-x}Ni$,
    group II-VI semiconductors, in particular ZnO, ZnS, ZnSe, ZnTe, CdS, CdSe, CdTe, $Hg_{(1-x)}Cd_{(x)}Te$, BeSe, $BeTe_x$ and HgS;
    group III-VI semiconductors, in particular GaS, GaSe, GaTe, InS, $InSe_x$ and InTe,
    group I-III-VI semiconductors, in particular $CuInSe_2$, $CuInGaSe_2$, $CuInS_2$ and $CuInGaS_2$,
    group IV-IV semiconductors, in particular SiC and SiGe,
    group IV-VI semiconductors, in particular SeTe;
  organic semiconductors, in particular polythiophene, tetracene, pentacene, phthalocyanines, PTCDA, MePTCDI, quinacridone, acridone, indanthrone, flaranthrone, perinone, $AlQ_3$, and mixed systems, in particular PEDOT:PSS and polyvinylcarbazole/TLNQ complexes;
  metals, in particular Ta, Ti, Co, Mo, Pt, Ru, Au, Ag, Cu, Al, W and Mg;
  conductive oxidic materials, in particular indium tin oxide (ITO), indium gallium oxide (IGO), InGa-$\alpha$-ZnO (IGZO), aluminium-doped zinc oxide (AZO), tin-doped zinc oxide (TZO), fluorine-doped tin oxide (FTO) and antimony tin oxide.

The molecular layer may optionally also be bonded to a thin (preferably 0.5-5 nm thick) oxidic or fluoridic interlayer, for example $TiO_2$, $Al_2O_3$, $HfO_2$, $SiO_2$ or LiF, which is located on the substrate.

The counter electrode or second electrode consists of a conducting or semiconducting material or a combination (layer stack) of a plurality of these materials. Examples are the materials mentioned as substrate material. Preference is given to Hg, In, Ga, InGa, Ag, Au, Cr, Pt, PdAu, Pb, Al, Mg, W, Yb, Zn, CNT (carbon nanotubes), graphene and conductive polymers (such as PEDOT:PSS).

The production and structuring of the electrodes is carried out by means of processes known to the person skilled in the art. The fabrication and electrical characterisation of switching elements comprising a molecular layer obtained from one or more compounds of formula I is carried out according to procedures described in WO 2016/110301 A1 and WO 2018/007337 A2.

EXAMPLES

Synthesis Example 1

Step 1: 1-(2,6-dimethyl-4-nitro-phenoxy)-2,3-difluoro-4-(4-pentylcyclohexyl)-benzene

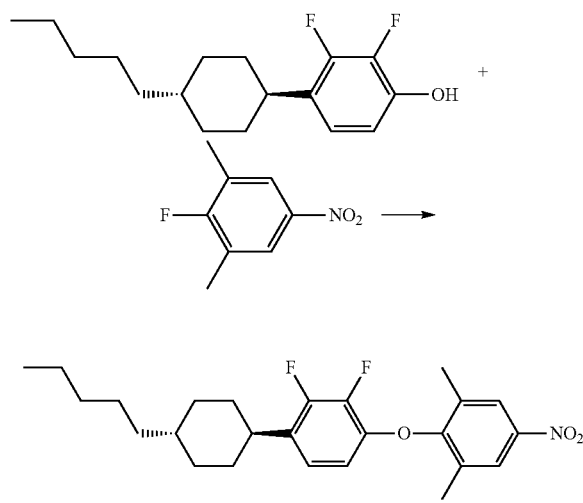

A solution of 2-fluoro-1,3-dimethyl-5-nitrobenzene (24.5 g, 0.145 mol) in dimethylsulfoxide (DMSO) (245 mL) is added to a suspension of 2,3-difluoro-4-(4-pentylcyclohexyl)phenol (49.1 g, 0.174 mol) and potassium carbonate in DMSO (245 mL) and is heated at 125° C. overnight under nitrogen. The mixture is cooled to 40° C., then added to water (1.5 L) and stirred for 30 min. Ethyl acetate (400 mL) and brine (50 mL) are added and the layers are separated. The aqueous layer is extracted further with ethyl acetate (2×300 mL). The organics are combined, dried over magnesium sulfate and the solvent is evaporated. The crude oil is dissolved in heptane (160 mL) and purified over silica gel (200 g) eluting with heptane followed by 5% ethyl acetate/heptane, followed by recrystallisation from acetonitrile to give 1-(2,6-dimethyl-4-nitro-phenoxy)-2,3-difluoro-4-(4-pentylcyclohexyl)-benzene as a beige solid.

$^{1}$H NMR (400 MHz, CDCl$_3$-d) δ ppm 0.89 (3H, t, J=7.0 Hz), 1.00-1.15 (2H, m), 1.17-1.35 (9H, m), 1.35-1.46 (2H, dd, J=12.3 Hz, 2.3 Hz), 1.86 (4H, br. d, J=10.9 Hz), 2.25 (6H, s), 2.77 (1H, m), 6.12 (1H, m), 6.75 (1H, m), 8.02 (2H, s).

$^{13}$C NMR (400 MHz, CDCl3-d) δ ppm 14.01, 16.36, 22.64, 32.12, 32.82, 33.30, 37.00, 37.15, 37.21, 109.16 (d, J=2.9 Hz), 120.77 (t, J=5.1 Hz), 124.34, 130.12 (dd, J=12.5 Hz, 1.5 Hz), 132.95, 140.69 (dd, J=248.7 Hz, 16.1 Hz), 143.43 (dd, J=8.8 Hz, 2.9 Hz), 144.79, 148.37 (dd, J=247.2 Hz, 10.3 Hz), 155.90.

$^{19}$F NMR (400 MHz, CDCl$_3$-d) δ ppm −158.9 (1 F, d, J=19.1 Hz), −141.4 (1 F, d, J=19.1 Hz).

Step 2: 4-[2,3-difluoro-4-(4-pentylcyclohexyl)phenoxy]-3,5-dimethyl-aniline

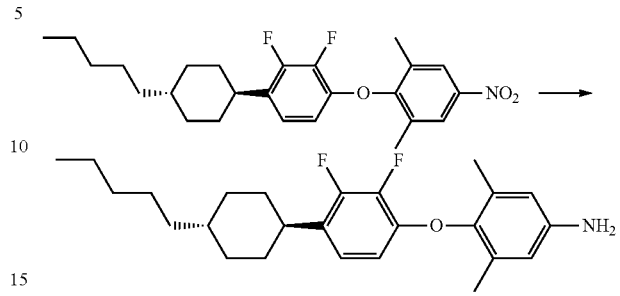

Pd/C (5% loading, 50% wetted, 1.95 g) is charged to a 2 L Parr pressure vessel followed by a solution of 1-(2,6-dimethyl-4-nitro-phenoxy)-2,3-difluoro-4-(4-pentylcyclohexyl)-benzene (39.0 g, 90.38 mmol) in isopropanol (585 mL) and tetrahydrofuran (THF, 117 mL). Hydrogen is charged to a pressure of 5 bar. After 90 min the pressure had dropped to ~1 bar. Hydrogen is re-charged to a pressure of 5 bar and stirred overnight. The catalyst is filtered off and washed with isopropanol (50 mL) and the filtrates concentrated to dryness to give 4-[2,3-difluoro-4-(4-pentylcyclohexyl)phenoxy]-3,5-dimethyl-aniline as an off-white solid.

$^{1}$H NMR (400 MHz, DMSO-d6) δ ppm 0.85 (3H, t, J=6.9 Hz), 0.95-1.07 (2H, m), 1.13-1.32 (9H, m), 1.33-1.46 (2H, m), 1.76 (4H, t, J=14.3 Hz), 1.90 (6H, s), 2.67 (1H, tm, J=12.0 Hz), 3.34 (1H, s), 4.93 (2H, s), 6.20 (1H, m), 6.32 (2H, s), 6.90 (1H, m).

$^{13}$C NMR (400 MHz, DMSO-d6) δ ppm 13.81, 15.70, 22.14, 26.04, 31.64, 32.36, 32.88, 36.40, 36.56, 36.78, 109.27, 114.03, 121.12 (m), 127.46 (d, J=11.7 Hz), 130.19, 139.63 (dd, J=245.4 Hz, 15.8 Hz), 140.27, 145.1 (m), 146.13, 148.65 (dd, J=243.6 Hz, 10.3 Hz).

$^{19}$F NMR (400 MHz, DMSO-d6) δ ppm −160.90 (1 F, d, J=21 Hz), −143.67 (1 F, d, J=21 Hz).

Step 3: 2,3-difluoro-1-(4-iodo-2,6-dimethyl-phenoxy)-4-(4-pentylcyclohexyl)benzene

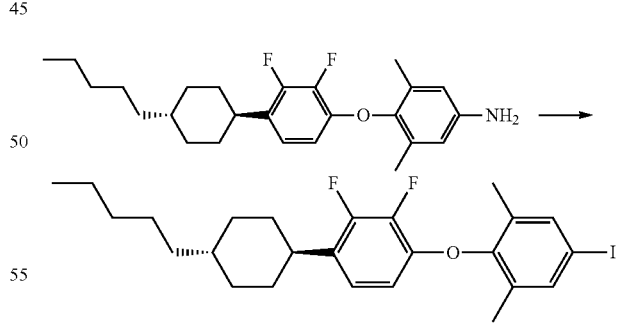

To a solution of 4-[2,3-difluoro-4-(4-pentylcyclohexyl) phenoxy]-3,5-dimethylaniline (29.8 g, 74.22 mmol) in dichloromethane (218 mL) a solution of sodium nitrite (25.6 g, 371.1 mmol) in water (218 mL) is added followed by addition of diiodomethane (39.76 g, 148.4 mmol). The mixture is stirred for 15 min, then acetic acid (89.1 g, 1.48 mol) is added dropwise. The mixture is stirred overnight at room temperature. The layers are separated and the aqueous extracted with dichloromethane. The organics are combined and washed with 20% sodium bisulfite and brine. The organics are dried over magnesium sulfate, and concentrated to dryness to give crude material as a red oil. The oil is purified on silica gel eluting with 2.5% dichloromethane/heptane and recrystallized from hot acetonitrile to give 2,3-difluoro-1-(4-iodo-2,6-dimethyl-phenoxy)-4-(4-pentyl-cyclohexyl)benzene as a white solid.

$^1$H NMR (400 MHz, CDCl$_3$-d) δ ppm 0.91 (3H, t, J=7.0 Hz), 1.04-1.12 (2H, m), 1.18-1.47 (11H, m), 1.87 (4H, br. d, J=10.8 Hz), 2.12 (6H, s), 2.77 (1H, tm, J=12.2 Hz), 6.14 (1H, m), 6.72 (1H, m), 7.46 (2H, m). $^{13}$C NMR (400 MHz, CDCl$_3$-d) δ ppm 14.11, 15.77, 22.69, 26.60, 32.17, 32.89, 33.37, 36.98, 37.20, 37.27, 89.70, 108.98 (d, J=3.7 Hz), 120.55 (m), 129.24 (d, J=12.5 Hz), 133.81, 137.84, 140.64 (dd, J=248.0 Hz, 16.2 Hz), 144.13 (dd, J=8.1 Hz, 2.9 Hz), 149.54 (dd, J=246.5 Hz, 10.3 Hz), 150.79. $^{19}$F NMR (400 MHz, CDCl$_3$-d) δ ppm −159.79 (1 F, d, J=20.5 Hz), −142.22 (1 F, d, J=20.5 Hz).

Step 4: 1-(4-diethoxyphosphoryl-2,6-dimethyl-phenoxy)-2,3-difluoro-4-(4-pentylcyclohexyl)benzene

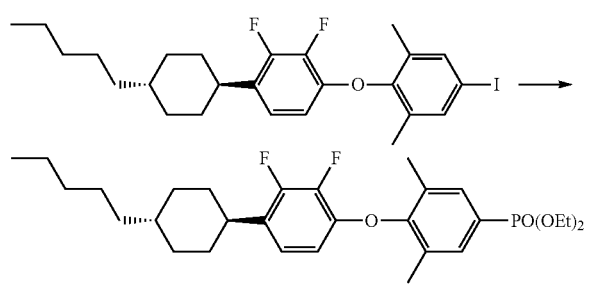

To 2,3-difluoro-1-(4-iodo-2,6-dimethyl-phenoxy)-4-(4-pentylcyclohexyl)benzene (28.5 g, 55.62 mmol) in dioxane (285 mL) triethyl phosphite (23.1 g, 139.05 mmol) is added under nitrogen. Pd(OAc)$_2$ (1.56 g, 6.95 mmol) is added and the reaction is heated to reflux for 75 min. The reaction is cooled to 30° C., heptane (400 mL) and water (400 mL) are added, the layers separated and the aqueous is extracted with ethyl acetate (400 mL). The organics are combined, washed with brine, dried over magnesium sulfate, filtered then concentrated to dryness. The crude material is purified on silica eluting with 10% ethyl acetate/dichloromethane to give 1-(4-diethoxyphosphoryl-2,6-dimethyl-phenoxy)-2,3-difluoro-4-(4-pentylcyclohexyl)benzene as an off-white solid.

$^1$H NMR (400 MHz, CDCl$_3$-d) δ ppm 0.89 (3H, t, J=7.0 Hz), 1.02-1.10 (2H, m), 1.15-1.45 (18H, m), 1.84 (4H, d, J=11.0 Hz), 2.18 (6H, s), 2.75 (1H, m), 4.06-4.23 (4H, m), 6.09 (1H, m), 6.71 (1H, m), 7.56 (2H, d, J=13.3 Hz).

$^{13}$C NMR (400 MHz, CDCl$_3$-d) δ ppm 13.97, 16.03, 16.25 (d, J=6.6 Hz), 22.58, 26.49, 32.06, 32.79, 32.26, 36.88, 37.09, 37.16, 62.07 (d, J=5.9 Hz), 109.08 (d, J=2.9 Hz), 120.51 (t, J=5.1 Hz), 125.15 (d, J=189.3 Hz), 129.36 (d, J=11.7 Hz), 131.82 (d, J=16.1 Hz), 132.64 (d, J=10.3 Hz), 140.58 (dd, J=248.3 Hz, 15.8 Hz), 143.82 (dd, J=8.4 Hz, 2.6 Hz), 149.47 (dd, J=246.2 Hz, 9.9 Hz), 154.16 (d, J=3.7 Hz).

$^{19}$F NMR (400 MHz, CDCl$_3$-d) δ ppm −159.6 (1 F, d, J=19 Hz), −142.1 (1 F, d, J=19 Hz).

$^{31}$P NMR (400 MHz, CDCl$_3$-d) δ ppm 18.80.

Step 5: [4-[2,3-difluoro-4-(4-pentylcyclohexyl)phenoxy]-3,5-dimethyl-phenyl]phosphonic acid

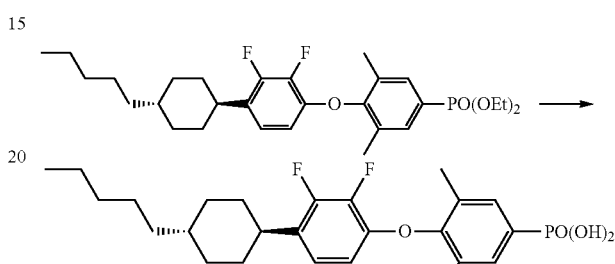

To 1-(4-diethoxyphosphoryl-2,6-dimethyl-phenoxy)-2,3-difluoro-4-(4-pentylcyclohexyl)benzene (22.35 g, 42.77 mmol) in dichloromethane (325 mL) trimethylsilyl bromide (65.82 g, 427.7 mmol) is added dropwise. The solution is stirred overnight at room temperature. Methanol (225 mL) is added over 15 min and the solution stirred for 30 min before concentrating to dryness. The resulting solid is dissolved in tetrahydrofuran (325 mL) and filtered through a 0.7µ glass fibre filter. Heptane (225 mL) is added and the THF is removed slowly until solid started to precipitate out, at which point, the evaporation is stopped and the mixture allowed to cool to room temperature with stirring overnight. The resultant solid is filtered off, washed with heptane and recrystallized from ethyl acetate to give [4-[2,3-difluoro-4-(4-pentylcyclohexyl)phenoxy]-3,5-dimethyl-phenyl]phosphonic acid as a white solid.

$^1$H NMR (400 MHz, THF-d) δ ppm 0.90 (3H, t, J=7.0 Hz), 1.03-1.14 (2H, m), 1.21-1.35 (9H, m), 1.42-1.52 (2H, m), 1.85 (4H, t, J=13.0 Hz), 2.14 (6H, s), 2.77 (1H, tm, J=12.1 Hz), 6.20 (1H, m), 6.80 (1H, m), 7.59 (2H, d, J=13.4 Hz).

$^{19}$F NMR (400 MHz, THF-d) δ ppm −162.86 (1 F, d, J=20.4 Hz), −145.71 (1 F, d, J=20.4 Hz).

$^{31}$P NMR (400 MHz, THF-d) δ ppm 15.91.

ES (−ve) MS: m/z=465.1998, 100% [M-H]$^-$, C$_{25}$H$_{32}$F$_2$O$_4$P$^-$ requires 465.2006.

In analogy to Example 1 the following compounds are obtained:

| No. | Compound |
| --- | --- |
| 1 | ![structure] |

-continued

| No. | Compound |
|---|---|
| 2 | 4-ethyl-2,3-difluorophenyl ether of 2,6-dimethyl-4-(dihydroxyphosphoryl)phenol |
| 3 | 4-propyl-2,3-difluorophenyl ether of 2,6-dimethyl-4-(dihydroxyphosphoryl)phenol |
| 4 | 4-butyl-2,3-difluorophenyl ether of 2,6-dimethyl-4-(dihydroxyphosphoryl)phenol |
| 5 | 4-pentyl-2,3-difluorophenyl ether of 2,6-dimethyl-4-(dihydroxyphosphoryl)phenol |
| 6 | 4-(but-3-en-1-yl)-2,3-difluorophenyl ether of 2,6-dimethyl-4-(dihydroxyphosphoryl)phenol |
| 7 | 4-methyl-2,3-difluorophenyl ether of 2,6-dimethyl-4-(dihydroxyphosphoryl)phenol |
| 8 | 4-methoxy-2,3-difluorophenyl ether of 2,6-dimethyl-4-(dihydroxyphosphoryl)phenol |
| 9 | 4-ethoxy-2,3-difluorophenyl ether of 2,6-dimethyl-4-(dihydroxyphosphoryl)phenol |
| 10 | 4-propoxy-2,3-difluorophenyl ether of 2,6-dimethyl-4-(dihydroxyphosphoryl)phenol |
| 11 | 4-butoxy-2,3-difluorophenyl ether of 2,6-dimethyl-4-(dihydroxyphosphoryl)phenol |

-continued
| No. | Compound |
|-----|----------|
| 12 | 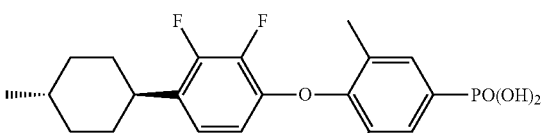 |
| 13 | 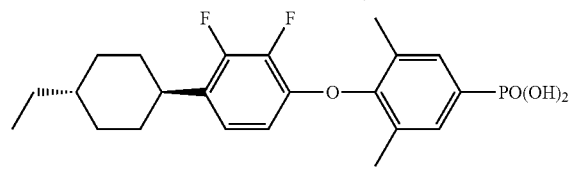 |
| 14 | 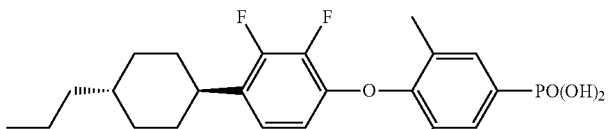 |
| 15 | 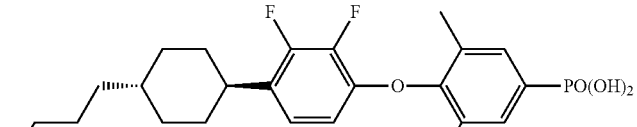 |
| 16 | 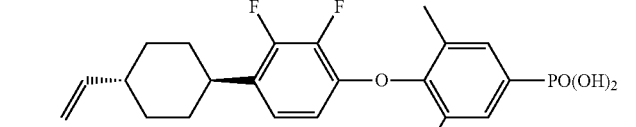 |
| 17 | 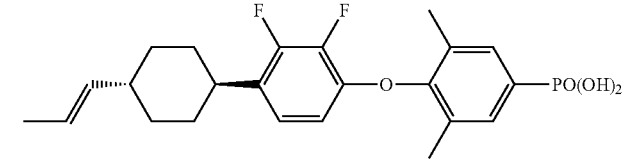 |
| 18 | 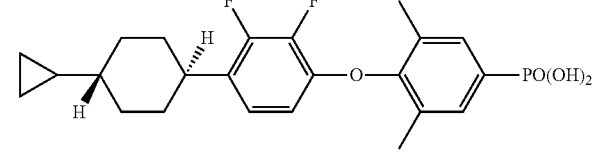 |
| 19 | 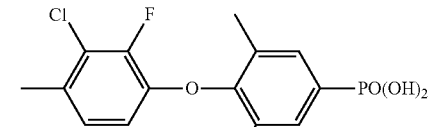 |
| 20 | 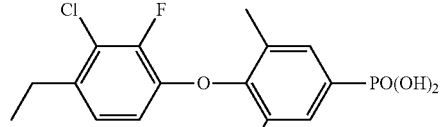 |
| 21 | 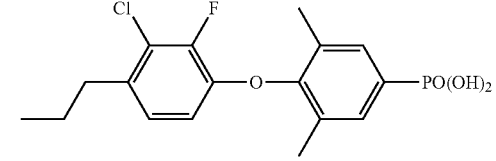 |

-continued

| No. | Compound |
|---|---|
| 22 | (3-chloro-2-fluoro-4-butylphenyl) (2,6-dimethyl-4-phosphonophenyl) ether |
| 23 | (3-chloro-2-fluoro-4-pentylphenyl) (2,6-dimethyl-4-phosphonophenyl) ether |
| 24 | (3-chloro-2-fluoro-4-(but-3-en-1-yl)phenyl) (2,6-dimethyl-4-phosphonophenyl) ether |
| 25 | (3-chloro-2-fluoro-4-methylphenyl) (2,6-dimethyl-4-phosphonophenyl) ether |
| 26 | (3-chloro-2-fluoro-4-methoxyphenyl) (2,6-dimethyl-4-phosphonophenyl) ether |
| 27 | (3-chloro-2-fluoro-4-ethoxyphenyl) (2,6-dimethyl-4-phosphonophenyl) ether |
| 28 | (3-chloro-2-fluoro-4-propoxyphenyl) (2,6-dimethyl-4-phosphonophenyl) ether |
| 29 | (2,3-difluoro-4-butoxyphenyl) (2,6-dimethyl-4-phosphonophenyl) ether |
| 30 | (2,3-difluoro-4-(trans-4-methylcyclohexyl)phenyl) (2,6-dimethyl-4-phosphonophenyl) ether |
| 31 | (2,3-difluoro-4-(trans-4-ethylcyclohexyl)phenyl) (2,6-dimethyl-4-phosphonophenyl) ether |

-continued

| No. | Compound |
|---|---|
| 32 | 3-propylcyclohexyl-2,3-difluorophenyl-O-(2,6-dimethyl-4-phosphonophenyl) |
| 33 | 4-butylcyclohexyl-2,3-difluorophenyl-O-(2,6-dimethyl-4-phosphonophenyl) |
| 34 | 4-vinylcyclohexyl-2,3-difluorophenyl-O-(2,6-dimethyl-4-phosphonophenyl) |
| 35 | 4-(prop-1-en-1-yl)cyclohexyl-2,3-difluorophenyl-O-(2,6-dimethyl-4-phosphonophenyl) |
| 36 | 4-cyclopropylcyclohexyl-2,3-difluorophenyl-O-(2,6-dimethyl-4-phosphonophenyl) |
| 37 | 4-methylcyclohexyl-2,3,2',3'-tetrafluorobiphenyl-O-(2,6-dimethyl-4-phosphonophenyl) |
| 38 | 4-ethylcyclohexyl-2,3,2',3'-tetrafluorobiphenyl-O-(2,6-dimethyl-4-phosphonophenyl) |
| 39 | 4-propylcyclohexyl-2,3,2',3'-tetrafluorobiphenyl-O-(2,6-dimethyl-4-phosphonophenyl) |
| 40 | 4-butylcyclohexyl-2,3,2',3'-tetrafluorobiphenyl-O-(2,6-dimethyl-4-phosphonophenyl) |

-continued
| No. | Compound |
|---|---|
| 41 | 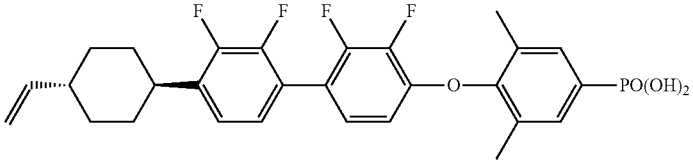 |
| 42 | 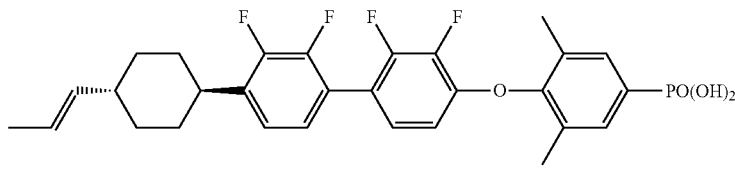 |
| 43 | 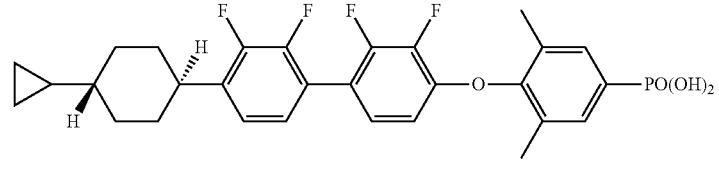 |
| 44 | 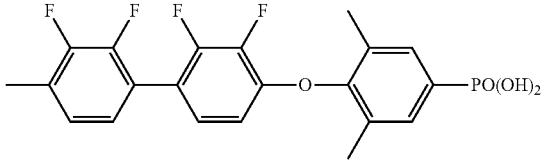 |
| 45 | 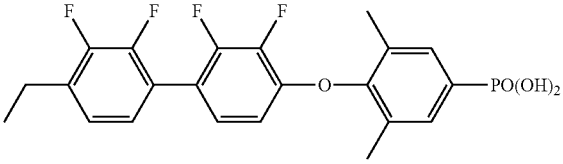 |
| 46 | 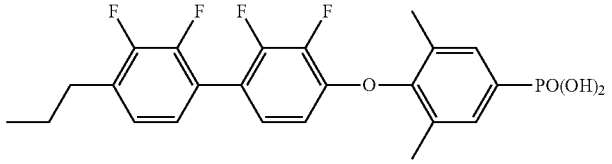 |
| 47 | 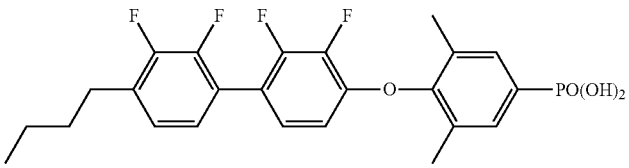 |
| 48 | 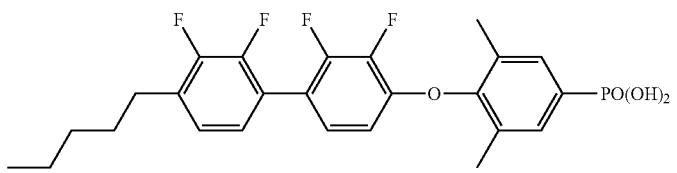 |
| 49 | 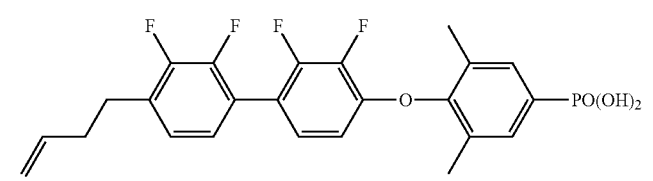 |

-continued

| No. | Compound |
|---|---|
| 50 | 3,2,2,3-tetrafluoro-4'-methoxy-biphenyl linked via O to 2,6-dimethylphenyl-PO(OH)₂ |
| 51 | 3,2,2,3-tetrafluoro-4'-ethoxy-biphenyl linked via O to 2,6-dimethylphenyl-PO(OH)₂ |
| 52 | 3,2,2,3-tetrafluoro-4'-propoxy-biphenyl linked via O to 2,6-dimethylphenyl-PO(OH)₂ |
| 53 | 3,2,2,3-tetrafluoro-4'-butoxy-biphenyl linked via O to 2,6-dimethylphenyl-PO(OH)₂ |
| 54 | 1-adamantyl-(2,3-difluorophenyl)-O-2,6-dimethylphenyl-PO(OH)₂ |
| 55 | 1-adamantyl-(3,2,2,3-tetrafluorobiphenyl)-O-2,6-dimethylphenyl-PO(OH)₂ |
| 56 | 1-adamantyl-cyclohexyl-(2,3-difluorophenyl)-O-2,6-dimethylphenyl-PO(OH)₂ |
| 57 | methoxy-fluoro-dibenzofuran-O-2,6-dimethylphenyl-PO(OH)₂ |

-continued

| No. | Compound |
|---|---|
| 58 | |
| 59 | |
| 60 | |
| 61 | |

-continued

| No. | Compound |
|---|---|
| | 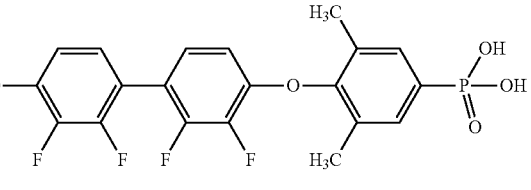 |

Comparative Solubility Test

The comparative solubilities of the following Reference Compound 1 (reference from DE102017005884):

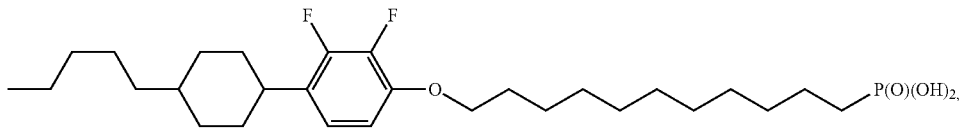

and of Synthesis Example 1 in various solvents at 1 mM concentration at 23° C. are experimentally determined. The sample is stirred for 18 h at 23° C. and then visually inspected. In the table below the expression "soluble" means that after 18 h a clear solution is obtained. "Not soluble" means that remaining solid is observed.

| Solvent | Reference 1 | Synthesis Example 1 |
|---|---|---|
| Ethyl acetate | Not soluble | Soluble |
| THF | Soluble | Soluble |
| Toluene | Soluble | Not soluble |
| Chloroform | Soluble | Soluble |
| 1-Methoxy-2-propanol acetate | Not soluble | Soluble |
| Cyclohexanone | Not soluble | Soluble |

In contrast to Reference 1, Synthesis Example 1 is soluble in a 1 mM concentration in the industry-typical, environmentally acceptable CMOS process solvents 1-methoxy-2-propanol acetate and cyclohexanone.

Electrical Characterisation

The electrical characterization of a switching device 100 (FIG. 1) comprising a molecular layer 140 obtained from the compound [4-[2,3-difluoro-4-(4-pentylcyclohexyl)phenoxy]-3,5-dimethyl-phenyl]phosphonic acid (Synthesis Example 1) sandwiched between a TiN first electrode 130 (thickness 50 nm) on a silicon substrate 110 with a silicon oxide layer 120, and a Ti second electrode 150 (10 nm) with gold contact 160 (80 nm) is done with a nanoprobe (Hitachi High Technologies Nano-Probe N-6000SS, probe size ca. 1 μm) and an Agilent B1500 device analyzer under SEM control.

For comparison, a switching device comprising a molecular layer prepared from 11-[2,3-difluoro-4-(4-pentylcyclohexyl)phenoxy]undecylphosphonic acid (PA-11O-YC-5, Reference Compound 1) is fabricated and characterized accordingly.

The starting material is a silicon-on-insulator wafer ("SOI wafer") with a diameter of 6 inches, having a silicon layer with a thickness of 110 nm with [100] orientation on a silicon oxide layer with a thickness of 200 nm on a slightly boron-doped silicon wafer with a thickness of 525 μm with [100] orientation and a resistivity of about 20 Ω·cm.

The upper silicon layer is highly boron-doped by ion implantation (doping concentration $c\sim5\times10^{19}$ cm$^{-3}$, resistivity $\rho\sim1.4$ mΩ·cm). After doping, the wafer is divided into square parts ("chips") measuring 8 mm×8 mm. The chips are cleaned firstly in acetone and subsequently in isopropanol in an ultrasound bath for 10 min in each case. The silicon dioxide interlayer 120 is fabricated by treatment of the wafer with oxygen plasma (200 W, 7 min).

The substrate is then coated with a 50 nm thick layer of TiN deposited by reactive sputtering, activated by ozone/UV treatment (110 W/300 s) and subsequently immersed into a 1 mM solution of the phosphonic acid [4-[2,3-difluoro-4-(4-pentylcyclohexyl)phenoxy]-3,5-dimethyl-phenyl]phosphonic acid (Synthesis Example 1) in tetrahydrofuran (THF)

for 24 h. The chip is removed from the immersion bath, blown dry with nitrogen and annealed under nitrogen at 120° C. for 60 min. Then, the chip is rinsed with THF on a spin-coater and subsequently annealed again under nitrogen at 120° C. for 5 min. The titanium top electrode 150 and the gold contact 160 are applied by sputtering using standard processes.

Figure 2:
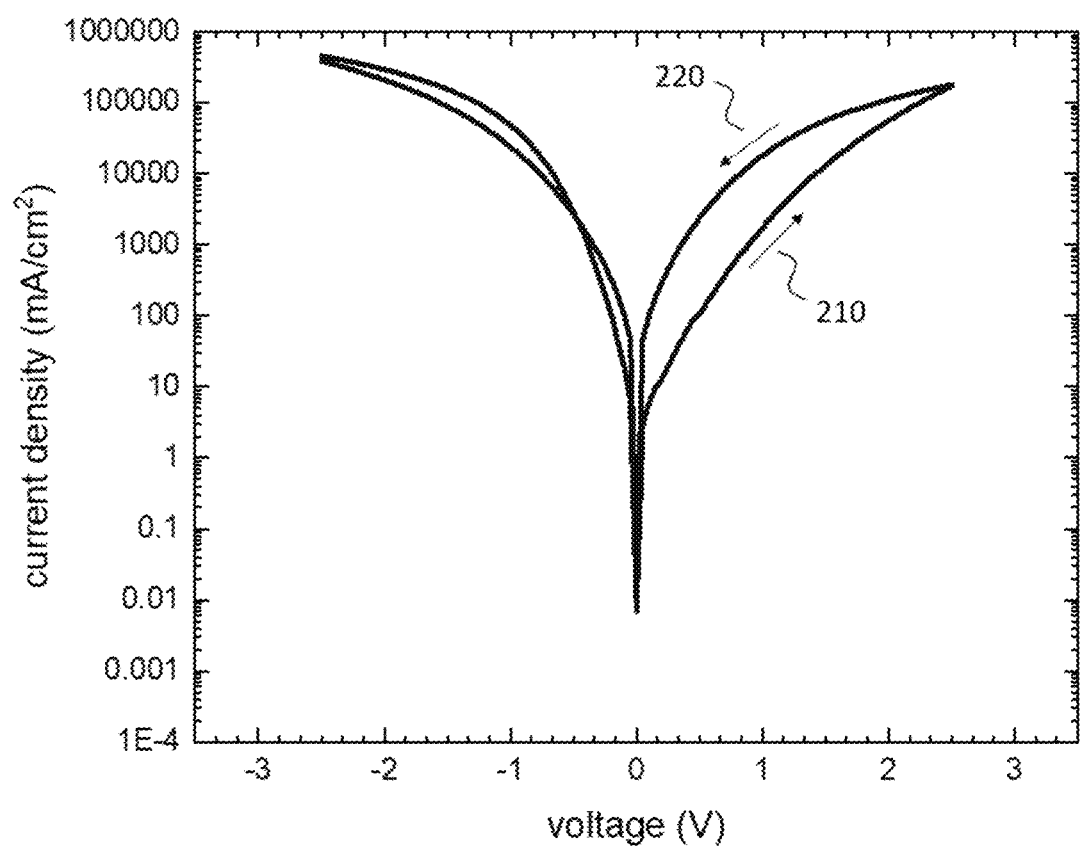

The result of the electrical characterisation of device 100 is shown in FIG. 2. A forward scan 210 starts at 0V and the voltage is increased to +3.5 V; a backward scan 220 then goes back to 0V, further up to −3.5 V and back to 0V. The scan speed is 300 mV/s. The resulting current is measured and the result is shown in FIG. 2. The device has an advantageously large memory window.

Figure 3:
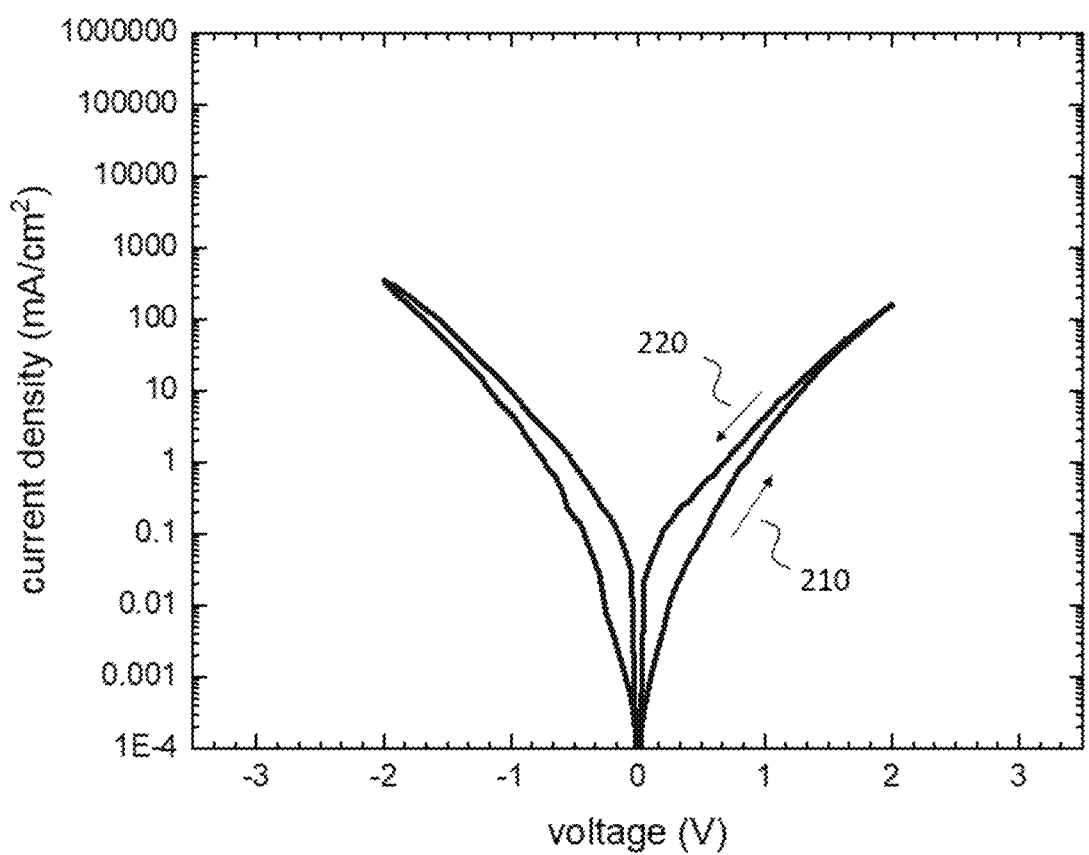

FIG. 3 shows the current density of a device fabricated with the comparative compound Reference Compound 1. The comparison shows that the device fabricated with the compound according to the invention shows an advantageously high current density, higher by a factor of approx. 1000.

The invention claimed is:
1. A compound of formula I

$$R^1\text{-}(A^1\text{-}Z^1)_r\text{—}B^1\text{—}Z^L\text{-}A^2\text{-}(Z^3\text{-}A^3)_s\text{-}G \quad (I)$$

in which
$R^1$ denotes H, straight chain or branched alkyl or alkoxy radical having up to 20 C atoms, where one or more CH$_2$ groups in these radicals may each be replaced, independently of one another, by —C≡C—, —CH═CH—,

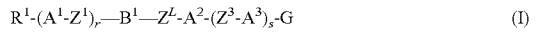

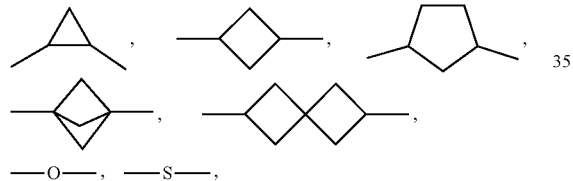

—O—, —S—,

—CF$_2$O—, —OCF$_2$—, —CO—O—, —O—CO—, —SiR$^0$R$^{00}$—, —NH—, —NR$^0$—, or —SO$_2$— in such a way that O atoms are not linked directly to one another, and in which, in addition, one or more H atoms may each be replaced by halogen, CN, SCN or SF$_5$, or alternatively, $R^1$ denotes a group Dia-$Z^D$,
Dia denotes a diamondoid radical,
$Z^D$ has one of the meanings of $Z^1$ and $Z^3$ or denotes a straight chain or branched spacer group,
$Z^1$, $Z^3$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH═CH—, —CF═CF—, —CF═CH—, —CH═CF—, —(CH$_2$)$_{n3}$O—, —O(CH$_2$)$_{n4}$—, —C≡C—, —O—, —S—, —CH═N—, —N═CH—, —N═N—, —N═N(O)—, —N(O)═N—, or —N═C—C═N—,
n1, n2, n3, n4 identically or differently, are 1, 2, 3, 4, 5, 6, 7, 8, 9 or 10,
$Z^L$ denotes -O—, —S—, —CH$_2$—, —C(O)—, —CF$_2$—, —CHF—, —C(R)$_2$—, —S(O)—, or —SO$_2$—,
$R^0$, $R^{00}$, identically or differently, denote an alkyl or alkoxy radical having 1 to 15 C atoms, in which one or more H atoms may each be replaced by halogen, $A^1$, $A^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y,
$A^2$ denotes an aromatic or heteroaromatic ring having 5 to 25 ring atoms, which may also contain condensed rings and which may be mono- or polysubstituted by Y,
Y on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having up to 12 C atoms, or cycloalkyl having 3 to 12 C atoms, or alkylcycloalkyl having 4 to 12 C atoms,
$B^1$ denotes

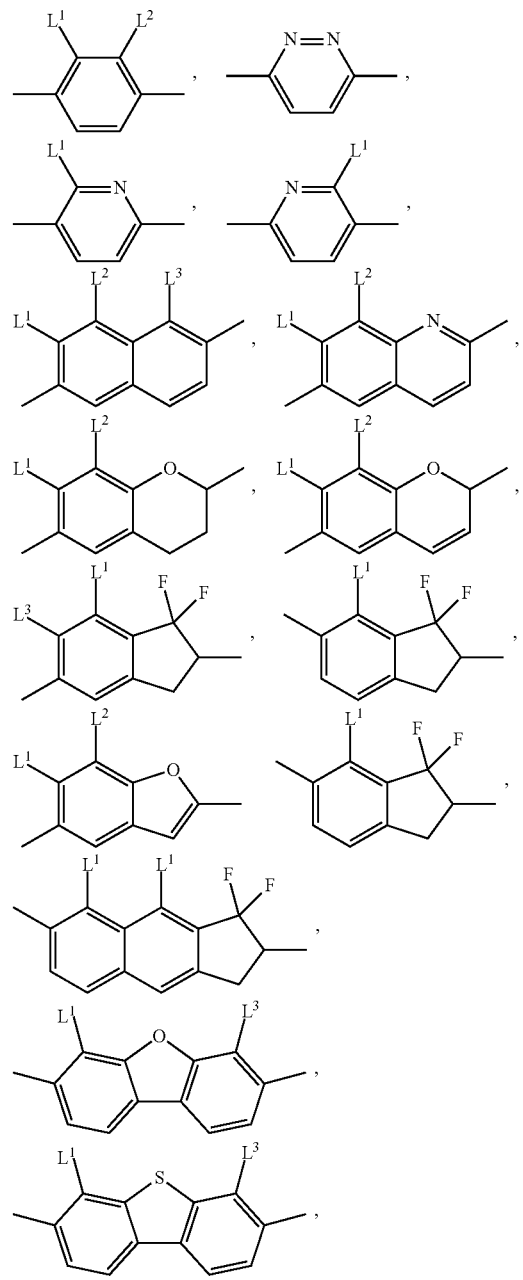

-continued

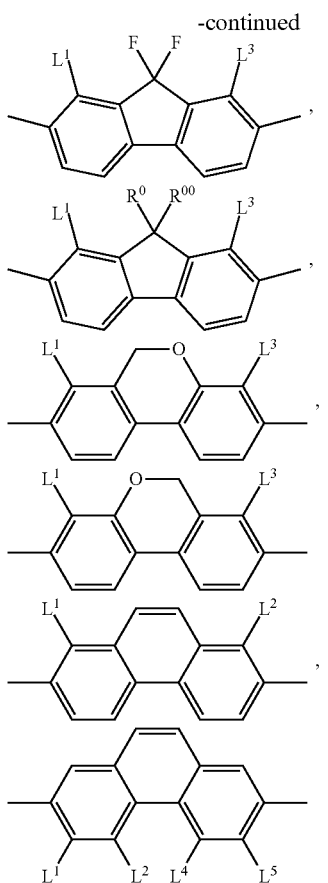

where the groups may be oriented in both directions,
L¹ to L⁵, independently of one another, denote F, Cl, Br, I, CN, SF₅, CF₃ or OCF₃, where L³ alternatively denotes H,
G denotes —OP(O)(OH)₂, —PO(OH)₂, or —C(OH)(PO(OH)₂)₂,
R$^x$ denotes straight-chain alkyl having 1 to 6 C atoms or branched alkyl having 3 to 6 C atoms, and
r is 0, 1 or 2, and
s is 0, 1 or 2,
where r+s≤4.

2. The compound according to claim 1, wherein the group B¹ denotes

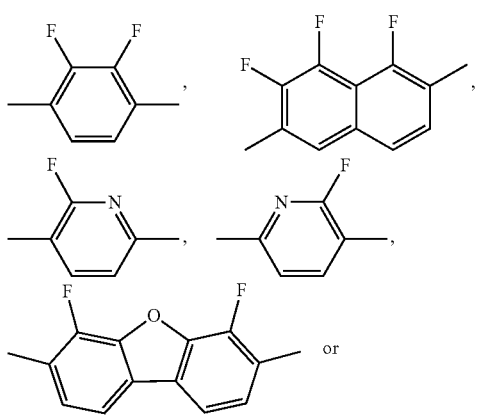

-continued

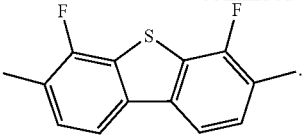

3. The compound according to claim 1, wherein A²-Z$^L$ denotes

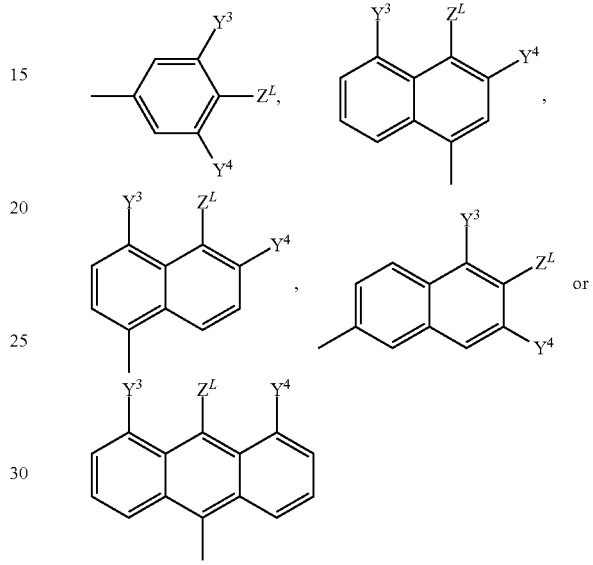

in which
Y³ and Y⁴ identically or differently, have the meanings given for Y in claim 1 and
Z$^L$ has the meanings given in claim 1.

4. The compound according to claim 1, wherein A¹ and A³, on each occurrence, identically or differently are selected from the following groups:
a) 1,4-phenylene, in which one or two CH groups may each be replaced by N and in which, in addition, one or more H atoms may each be replaced by Y,
b) the group consisting of trans-1,4-cyclohexylene and 1,4-cyclohexenylene, in which one or more non-adjacent CH₂ groups may each be replaced by —O— and/or —S— and in which, in addition, one or more H atoms may each be replaced by Y, and
c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which one or more H atoms may each be replaced by Y,
where Y has the meanings given in claim 1.

5. The compound according to claim 1, wherein R¹ denotes H, straight chain or branched alkyl, alkenyl, alkynyl, or alkoxy each having up to 12 C atoms, or adamantyl or adamantylmethyloxy.

6. The compound according to claim 1, wherein Z$^L$ denotes —O—.

7. The compound according to claim 1, wherein s is 0.

8. The compound according to claim 1, wherein Z¹ denotes a single bond.

9. A process for the preparation of a switching element comprising:

a) producing a first electrode with a surface,
b) depositing a molecular layer comprising one or more compounds of the formula I according to claim 1 onto the surface of the first electrode, and
c) application of a second electrode.

10. The process according to claim 9, wherein the first electrode comprises a material selected from Si, Ge, diamond, graphite, graphene, Sn having alpha modification, Se, GaAs, InAs, InP, GaSb, TaN, TiN, MON, WN and GaN, CdSe and ZnS, Au, Ag, Cu, Al, W, Ta, Ti, Co, Mo, Pt, Ru, Mg, ITO, IGO, IGZO, AZO, and FTO.

11. A switching element comprising a molecular layer sandwiched between a first electrode and a second electrode, obtainable by the process according to claim 9.

12. The switching element according to claim 11, wherein the molecular layer is a self assembled monolayer.

13. A memristive device comprising a switching element according to claim 12.

14. The compound according to claim 1, wherein Y, on each occurrence, identically or differently, denotes methyl, ethyl, isopropyl, cylopropyl, cyclobutyl, cyclopentyl, cyclohexyl, trifluoromethyl, methoxy, or trifluoromethoxy.

15. The compound according to claim 1, wherein $L^1$ to $L^5$, independently of one another, Cl or F, and where $L^3$ alternatively denotes H.

* * * * *